(12) United States Patent
Maehara (10) Patent No.: US 10,699,907 B2
(45) Date of Patent: Jun. 30, 2020

(54) ORGANIC THIN FILM TRANSISTOR AND METHOD FOR MANUFACTURING ORGANIC THIN FILM TRANSISTOR

(71) Applicant: FUJIFILM Corporation, Tokyo (JP)

(72) Inventor: Yoshiki Maehara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 163 days.

(21) Appl. No.: 15/909,746

(22) Filed: Mar. 1, 2018

(65) Prior Publication Data

US 2018/0190495 A1 Jul. 5, 2018

Related U.S. Application Data

(63) Continuation of application No. PCT/JP2016/076632, filed on Sep. 9, 2016.

(30) Foreign Application Priority Data

Sep. 24, 2015 (JP) .................................. 2015-186767

(51) Int. Cl.
*H01L 21/28* (2006.01)
*H01L 51/05* (2006.01)
(Continued)

(52) U.S. Cl.
CPC ............ *H01L 21/28* (2013.01); *H01L 29/517* (2013.01); *H01L 29/786* (2013.01);
(Continued)

(58) Field of Classification Search
CPC ........... H01L 21/0275; H01L 21/76894; H01L 21/02354; H01L 29/7869; H01L 29/78693;
(Continued)

(56) References Cited

U.S. PATENT DOCUMENTS

2004/0108562 A1* 6/2004 Nagayama .......... H01L 51/0021
257/434
2005/0007398 A1* 1/2005 Hirai ..................... H01L 21/288
347/1
(Continued)

FOREIGN PATENT DOCUMENTS

JP 2006-147613 A 6/2006
JP 2008-066510 A 3/2008
(Continued)

OTHER PUBLICATIONS

International Search Report issued in PCT/JP2016/076632; dated Nov. 22, 2016.
(Continued)

*Primary Examiner* — Mohsen Ahmadi
(74) *Attorney, Agent, or Firm* — Studebaker & Brackett PC (57) ABSTRACT

An organic thin film transistor comprises a base material, a gate electrode, a gate insulating layer, an organic semiconductor layer, a source electrode, and a drain electrode, and further comprises charge injection layers which are provided between the source electrode and a base material side layer of the source electrode and between the drain electrode and a base material side layer of the drain electrode and have a thickness that decreases in a direction opposite to a direction in which the source electrode and the drain electrode face each other on a side of the source electrode facing the drain electrode and a side of the drain electrode facing the source electrode, and is manufactured by scanning a metal layer with a laser so as to form the source electrode and the drain electrode, and dropwise-adding a solution which becomes the charge injection layers to a laser-scanned portion.

9 Claims, 4 Drawing Sheets

(51) Int. Cl.
*H01L 51/00* (2006.01)
*H01L 51/10* (2006.01)
*H01L 29/51* (2006.01)
*H01L 29/786* (2006.01)
*H01L 29/08* (2006.01)

(52) U.S. Cl.
CPC ...... *H01L 51/0003* (2013.01); *H01L 51/0012* (2013.01); *H01L 51/05* (2013.01); *H01L 51/0545* (2013.01); *H01L 51/0562* (2013.01); *H01L 51/105* (2013.01); *H01L 29/08* (2013.01)

(58) Field of Classification Search
CPC ............. H01L 51/105; H01L 29/78687; H01L 51/0562; H01L 29/78696; H01L 51/0002; H01L 51/0003; H01L 51/0545; H01L 51/0558; H01L 51/0012; H01L 51/05; H01L 29/08; H01L 29/517; H01L 29/786
See application file for complete search history.

(56) References Cited

U.S. PATENT DOCUMENTS

| | | | | |
|---|---|---|---|---|
| 2005/0242342 A1* | 11/2005 | Suh | ............ | H01L 51/0529 257/40 |
| 2007/0158648 A1* | 7/2007 | Suh | ............ | H01L 51/0545 257/40 |
| 2008/0048183 A1* | 2/2008 | Ohsawa | ............ | H01L 27/3274 257/40 |
| 2009/0014722 A1* | 1/2009 | Doi | ............ | H01L 27/1214 257/59 |
| 2009/0166612 A1 | 7/2009 | Cain et al. | | |
| 2010/0297809 A1* | 11/2010 | Imahayashi | ......... | H01L 51/0541 438/99 |
| 2012/0280229 A1 | 11/2012 | Suzuki et al. | | |
| 2012/0313092 A1* | 12/2012 | Shieh | ............ | H01L 21/428 257/43 |
| 2013/0009135 A1* | 1/2013 | Katsuhara | ........... | H01L 51/0562 257/40 |
| 2013/0153885 A1* | 6/2013 | Mueller | ............. | H01L 51/0012 257/40 |
| 2013/0285026 A1* | 10/2013 | Miskiewicz | ........ | H01L 51/0034 257/40 |
| 2014/0159026 A1* | 6/2014 | Okumoto | ............. | H01L 29/786 257/40 |
| 2015/0295179 A1* | 10/2015 | Li | ...................... | H01L 51/0035 252/500 |

FOREIGN PATENT DOCUMENTS

| | | |
|---|---|---|
| JP | 2009-531848 A | 9/2009 |
| JP | 5445533 B2 | 3/2014 |
| KR | 100730188 B1 * | 6/2007 |
| WO | 2011/142089 A1 | 11/2011 |

OTHER PUBLICATIONS

Written Opinion issued in PCT/JP2016/076632; dated Nov. 22, 2016.

Pavel A. Troshin et al.; "Material Solubility-Photovoltaic Performance Relationship in the Design of Novel Fullerene Derivatives for Bulk Heterojunction Solar Cells"; Advanced Functional Materials; 2009; pp. 779-788; vol. 19.

Yutaka Matsuo et al.; "Columnar Structure in Bulk Heterojunction in Solution-Processable Three-Layered p-i-n Organic Photovoltaic Devices Using Tetrabenzoporphyrin Precursor and Silylmethyl[60]fullerene"; Journal of the American Chemical Society; 2009; p. 16048-16050; vol. 131.

* cited by examiner

ORGANIC THIN FILM TRANSISTOR AND METHOD FOR MANUFACTURING ORGANIC THIN FILM TRANSISTOR

CROSS-REFERENCE TO RELATED APPLICATIONS

This application is a Continuation of PCT International Application No. PCT/JP2016/076632 filed on Sep. 9, 2016, which claims priority under 35 U.S.C. § 119(a) to Japanese Patent Application No. 2015-186767 filed on Sep. 24, 2015. The above application is hereby expressly incorporated by reference, in its entirety, into the present application.

BACKGROUND OF THE INVENTION

1. Field of the Invention

The present invention relates to an organic thin film transistor for which an organic semiconductor material is used and a method for manufacturing an organic thin film transistor.

2. Description of the Related Art

Since it is possible to reduce the weight and costs and make apparatuses more flexible, organic thin film transistors (organic TFTs) having an organic semiconductor layer (organic semiconductor film) made of an organic semiconductor material are used for apparatuses and the like for which logic circuits such as thin film transistors (TFTs), RFIDs (RF tags), and memories that are used in liquid crystal displays and organic EL displays are used.

In recent years, in response to an increase in the integration of electronic circuits in which organic thin film transistors are used, there has been a demand for shortening the intervals between source electrodes and drain electrodes, that is, the channel lengths. In addition, the channel lengths are advantageously short from the viewpoint of mobility, that is, switching speed, responsiveness, and the like.

However, even in a case in which the channel lengths are simply shortened, the contact resistances between source electrodes and organic semiconductors and between drain electrodes and organic semiconductors limit on currents.

Meanwhile, methods for improving mobility by inserting charge injection layers (buffer layers) between organic semiconductor layers and source electrodes and between organic semiconductor layers and drain electrodes and thus decreasing the contact resistances between source electrodes and organic semiconductors and between drain electrodes and organic semiconductors are also known.

However, in this constitution, the resistance of the charge injection layers is not ignorable, and thus the improvement in the characteristics of organic thin film transistors is limited.

In contrast, JP5445533B describes a constitution of an organic thin film transistor in which each of a source electrode and a drain electrode (a first electrode and a second electrode) are formed of a metal layer and a charge injection layer (mixture layer) that coats the metal layer, and the charge injection layer is made of a mixture of a conductive macromolecular material and metal particles having dopants for controlling conduction types attached to the surface. In addition, JP5445533B describes that the charge injection layer is formed at least in a region in which each of the source electrode and the drain electrode is in contact with a channel region.

According to the organic thin film transistor described in JP5445533B, the source electrode and the drain electrode are coated with the charge injection layers, and thus it is possible to improve the mobility of the organic thin film transistor by decreasing the contact resistances with an organic semiconductor layer.

SUMMARY OF THE INVENTION

Here, in the constitution in which the charge injection layers are formed between the organic semiconductor layer and the source electrode and between the organic semiconductor layer and the drain electrode, the charge injection layers between channels serve as current paths. Therefore, in a case in which the resistance of the charge injection layer is too low, the off current of the organic thin film transistor excessively increases, and thus short-circuit faults are likely to be caused.

That is, in organic thin film transistors, an increase and decrease of the resistivity of charge injection layers have a trade-off relationship between mobility and stability, and at the moment, a sufficient mobility improvement effect cannot be obtained with methods in which charge injection layers are used.

An object of the present invention is to solve the above-described problem of the related art and to provide an organic thin film transistor in which a high mobility can be obtained using a charge injection layer and a method for manufacturing an organic thin film transistor.

In order to achieve the above-described object, an organic thin film transistor of the present invention provides an organic thin film transistor comprising: a base material; a gate electrode, a gate insulating layer, an organic semiconductor layer, a source electrode, and a drain electrode which are formed on the base material; and charge injection layers which are provided between the source electrode and a layer on a base material side of the source electrode and between the drain electrode and a layer on a base material side of the drain electrode and have a thickness that decreases in a direction opposite to a direction in which the source electrode and the drain electrode face each other on a side of the source electrode facing the drain electrode and a side of the drain electrode facing the source electrode.

In the above-described organic thin film transistor of the present invention, it is preferable that the charge injection layer on the source electrode side and the charge injection layer on the drain electrode side are connected to each other.

In addition, it is preferable that the gate electrode, the gate insulating layer, the organic semiconductor layer, and the source electrode and the drain electrode are laminated in this order from the base material.

In addition, it is preferable that the organic semiconductor layer, and the source electrode and the drain electrode are laminated in this order from the base material, and a buffer layer is further provided between the organic semiconductor layer and the source electrode and the drain electrode.

In addition, it is preferable that the base material is a flexible film.

In addition, it is preferable that the organic semiconductor layer is made of a p-type organic semiconductor, and the charge injection layers have a hole-transporting property.

Furthermore, it is preferable that the organic semiconductor layer is made of an n-type organic semiconductor, and the charge injection layers have an electron-transporting property.

In addition, a method for manufacturing an organic thin film transistor of the present invention provides a method for manufacturing an organic thin film transistor having a gate electrode, a gate insulating layer, an organic semiconductor layer, a source electrode, a drain electrode, and charge injection layers, the method comprising: a step of forming a metal layer which becomes the source electrode and the drain electrode; a step of forming the source electrode and the drain electrode by removing a part of the metal layer by scanning with laser light; and a step of adding dropwise a solution including a forming material of the charge injection layers in a region from which the metal layer is removed and drying the solution.

In the above-described method for manufacturing an organic thin film transistor of the present invention, in the step of forming the metal layer, it is preferable that a surface on which the metal layer is formed has water repellency.

Furthermore, in the step of forming the metal layer, it is preferable that the surface on which the metal layer is formed is an organic semiconductor layer.

According to the present invention, it is possible to obtain an organic thin film transistor having a high mobility and to preferably manufacture this organic thin film transistor.

DESCRIPTION OF THE PREFERRED EMBODIMENTS

Hereinafter, an organic thin film transistor of the present invention and a method for manufacturing an organic thin film transistor will be described in detail on the basis of preferred examples illustrated in the accompanying drawings.

Figure 1A:
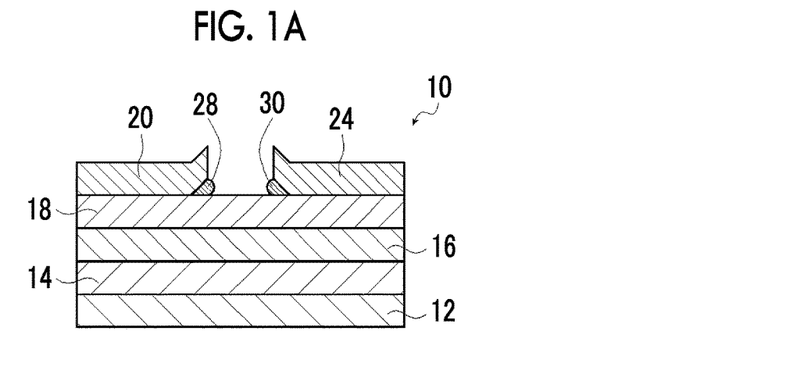
FIG. 1A is a cross-sectional view conceptually illustrating an example of an organic thin film transistor of the present invention.

FIG. 1A conceptually illustrates a cross-sectional view of an example of the organic thin film transistor of the present invention. Meanwhile, FIG. 1A (FIGS. 1A to 1D) is a cross-sectional view of the organic thin film transistor cut in a channel length direction.

As illustrated in FIG. 1A, an organic thin film transistor 10 has a base material 12, a gate electrode 14, a gate insulating layer 16, an organic semiconductor layer 18, a source electrode 20, a drain electrode 24, and charge injection layers 28 and 30.

In the organic thin film transistor 10 of the illustrated example, each of the source electrode 20 and the drain electrode 24 has a slightly elevated shape (raised shape) in an end portion on a side on which the source electrode faces the drain electrode or vice versa. In the organic thin film transistor 10, in regions in which these electrodes are elevated, the charge injection layer 28 is formed between the organic semiconductor layer 18 and the source electrode 20, and the charge injection layer 30 is formed between the organic semiconductor layer 18 and the drain electrode 24.

Furthermore, the charge injection layers 28 and 30 have a shape in which the thickness decreases in a direction opposite to the direction in which the source electrode 20 and the drain electrode 24 face each other.

What has been described above will be described in detail below.

Basically, the organic thin film transistor 10 of the present invention is a well-known organic thin film transistor except for the fact that the charge injection layers 28 and 30 having a shape in which the thickness decreases in the direction opposite to the direction in which the source electrode 20 and the drain electrode 24 face each other are provided below the end portions on the sides on which the source electrode 20 and the drain electrode 24 face each other.

Therefore, the sizes, shapes, thicknesses, and the like of the respective portions such as the gate electrode 14, the gate insulating layer 16, the organic semiconductor layer 18, the source electrode 20, and the drain electrode 24 may be appropriately determined to be the same as those of well-known organic thin film transistors (organic thin film transistor arrays) depending on the forming materials of the respective portions, the size of the organic thin film transistor 10 to be produced, the array of the organic thin film transistor 10, the necessary performance of the organic thin film transistor 10 (organic thin film transistor arrays), and the like.

In the organic thin film transistor 10 of the present invention, as the base material 12, a variety of sheet-like articles made of a variety of materials that are used as base materials (substrates) in organic thin film transistors can be used.

Specific examples thereof include sheet-like articles made of a variety of materials such as glass, metals having an insulating layer such as an oxide layer formed on the surface, ceramic, and resins (plate-like articles and film-like articles).

Among these, flexible film-like base materials are preferably used since it is possible to form flexible organic thin film transistors (organic thin film transistor arrays). Specifically, resin films made of a variety of resin materials are preferably used as the base material 12.

Specific examples of the forming material of the resin films that are used as the base material 12 include thermoplastic resins such as polyester resins, methacrylic resins, methacrylic acid-maleic acid copolymers, polystyrene resins, fluororesins, polyimides, fluorinated polyimide resins, polyamide resins, polyamideimide resins, polyetherimide resins, cellulose acrylate resins, polyurethane resins, polyether ether ketone resins, polycarbonate resins, alicyclic polyolefin resins, polyarylate resins, polyether sulfone resins, polysulfone resins, cycloolefin copolymers, fluorene-modified polycarbonate resins, alicyclic modified polycarbonate resins, fluorene ring-modified polyester resins, and acryloyl compounds.

In the present invention, the base material 12 may have a multilayer constitution such as a constitution in which a plurality of resin films is attached together.

On one surface of the base material 12, the gate electrode 14 is formed.

The gate electrode 14 is also a well-known gate electrode that is used in organic thin film transistors.

Therefore, as the forming material of the gate electrode 14, similarly, a variety of well-known articles that are used as gate insulating layers in organic thin film transistors can be used. Specific examples of the forming material of the gate electrode 14 include metals such as aluminum, chromium, copper, molybdenum, tungsten, gold, and silver, alloys, transparent conductive oxides (TCO) such as indium tin oxide (ITO), and conductive macromolecules such as polyethylene dioxythiophene-polystyrene sulfonate (PEDOT-PSS).

In addition, the gate electrode 14 may have a laminate structure formed by laminating layers made of the above-described materials.

On the gate electrode 14, the gate insulating layer 16 is formed. Meanwhile, in the present specification, "on" refers to the side opposite to the base material 12, and "below" refers to the base material 12 side, respectively.

The gate insulating layer 16 is also a well-known gate insulating layer that is used in organic thin film transistors.

Therefore, as the forming material of the gate insulating layer 16, similarly, a variety of well-known articles that are used as gate insulating layers in organic thin film transistors can be used. Specific examples of the forming material of the gate insulating layer 16 include metal oxides such as silicon oxide ($SiO_x$), magnesium oxide, aluminum oxide (alumina), titanium oxide, germanium oxide, yttrium oxide, zirconium oxide, niobium oxide, and tantalum oxide, metal nitrides such as silicon nitrides ($Si_xN_y$), metal nitrided oxides (metal oxided nitrides) such as silicon nitrided oxide ($Si_xON_y$), inorganic materials such as diamond-like carbon (DLC), and a variety of macromolecular materials.

In addition, the gate insulating layer 16 may have a laminate structure formed by laminating layers made of the above-described materials.

On the gate insulating layer 16, the organic semiconductor layer 18 is formed.

The organic semiconductor layer 18 is also an organic semiconductor layer made of a well-known organic semiconductor material that is used in organic thin film transistors. In addition, the organic semiconductor layer 18 may be a p-type organic semiconductor layer or an n-type organic semiconductor layer.

Therefore, as the organic semiconductor material, a variety of well-known materials that are used for organic semiconductor layers in organic thin film transistors can be used. Specific examples thereof include pentacene derivatives such as 6,13-bis(triisopropylsilylethynyl)pentacene (TIPS pentacene), anthradithiophene derivatives such as 5,11-bis(triethylsilylethynyl)anthradithiophene (TES-ADT), bensodithiophene (BDT) derivatives, benzothienobenzothiophene (BTBT) derivatives such as dioctylbenzothienobenzothiophene (C8-BTBT), dinaphtho-thienothiophene (DNTT) derivatives, dinaphtho-benzodithiophene (DNBDT) derivatives, 6,12-dioxaanthanthrene(peri-xanthenoxanthene) derivatives, naphthalenetetracarboxylic dimide (NTCDI) derivatives such as N,N'-bis(cyclohexyl)naphthalene-1,4,5,8-bis(dicarboxyimide), perylenetetracarboxylic diimide (PTCDI) derivatives, polythiophene derivatives, poly(2,5-bis(thiophene-2-yl)thieno[3,2-b]thiophene) (PBTTT) derivatives, tetracyanoquinodimethane (TCNQ) derivatives, oligothiophenes, phthalocyanines, fullerenes, and the like.

On the organic semiconductor layer 18, the source electrode 20 and the drain electrode 24 are formed.

Basically, the source electrode 20 and the drain electrode 24 are a well-known source electrode 20 and a well-known drain electrode 24 that are used in organic thin film transistors except for the fact that the end portions on the side on which both electrodes face each other are in a state of being elevated, and the charge injection layers 28 and 30 are provided between these elevated regions and the organic semiconductor layer 18 which is the layer below the electrodes.

Therefore, as the forming material of the source electrode 20 and the drain electrode 24, similarly, a variety of well-known articles that are used as the source electrode 20 and the drain electrode 24 in organic thin film transistors can be used. Specific examples of the forming material include a variety of the materials exemplified in the section of the above-described gate electrode 14.

Meanwhile, in the organic thin film transistor 10 of the illustrated example, the upper surfaces of the source electrode 20 and the drain electrode 24 form a protrusion shape along the elevation of the end portions on the sides on which both electrodes face each other in the end portions, but the present invention is not limited thereto, and the upper surfaces of the source electrode 20 and the drain electrode 24 may have a flat shape.

The organic thin film transistor 10 of the present invention has the charge injection layers 28 and 30.

As described above, each of the source electrode 20 and the drain electrode 24 has a shape that is slightly elevated from the organic semiconductor layer 18 in the end portion on the side on which the source electrode faces the drain electrode or vice versa. In other words, each of the source electrode 20 and the drain electrode 24 has a shape that is slightly rolled up from the organic semiconductor layer 18 in the end portion on the side on which the source electrode faces the drain electrode or vice versa.

In the elevated portion in the end portion of the source electrode 20, the charge injection layer 28 is formed between the source electrode 20 and the organic semiconductor layer 18 which is the layer below the electrode. That is, in the end portion of the source electrode 20 on the side facing the drain electrode 24, the charge injection layer 28 is provided so as to be inserted into the lower side of the source electrode 20, that is, the base material 12 side.

In the elevated portion in the end portion of the drain electrode 24, the charge injection layer 30 is formed between the drain electrode 24 and the organic semiconductor layer 18 which is the layer below the electrode. That is, in the end portion of the drain electrode 24 on the side facing the source electrode 20, the charge injection layer 30 is provided so as to be inserted into the lower side of the drain electrode 24, that is, the base material 12 side.

Figure 1B:
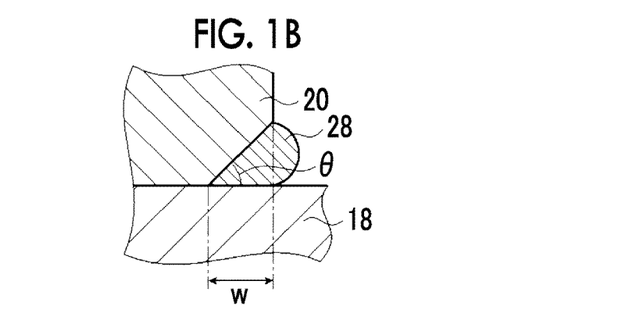
FIG. 1B is a partially enlarged view of FIG. 1A.

In addition, like the charge injection layer 28 on the source electrode 20 side illustrated in FIG. 1B as a typical example, the charge injection layers 28 and 30 have a shape in which the thickness gradually decreases in a direction opposite to the direction in which the source electrode 20 and the drain electrode 24 face each other.

The organic thin film transistor 10 of the present invention has the charge injection layers 28 and 30 having the above-described shape on the sides on which the source electrode 20 and the drain electrode 24 face each other and thus realizes organic thin film transistors having a high mobility.

As well known, charge injection layers that are provided in organic thin film transistors refer to layers for injecting charges (electrons or holes) into organic semiconductor layers. In a case in which organic thin film transistors have the above-described charge injection layer, the injection efficiency of charges improves, and thus the mobility can be improved.

In organic thin film transistors of the related art, charge injection layers are provided between source electrodes and organic semiconductor layers and between drain electrodes and organic semiconductor layers in a form of a flat film having a uniform thickness. In addition, as described in JP5445533B, it is also known that regions in source electrodes and drain electrodes which are in contact with channel regions are coated with charge injection layers.

In organic thin film transistors, charges flow from source electrodes or drain electrodes to corresponding electrodes through the interfaces between gate insulating layers and organic semiconductor layers.

Therefore, in constitution having charge injection layers, in the case of, for example, a bottom gate-top contact-type organic thin film transistor as illustrated in FIG. 1A, in a case in which the organic thin film transistor is a p-type transistor, holes move along paths which penetrate through charge injection layers and organic semiconductor layers from source electrodes, flow through the interfaces between gate insulating layers and the organic semiconductor layers, again, penetrate through the organic semiconductor layers and the charge injection layers, and reach drain electrodes.

Therefore, in organic thin film transistors of the related art which have charge injection layers, the charge injection layers for improving the mobility serve as resistance to the flow of charges, and a sufficient mobility improvement effect cannot be obtained. In addition, in a case in which the resistance of charge injection layers is too low, off currents increase, and thus short-circuit faults and the like are caused, and the operation of organic thin film transistors becomes unstable.

In contrast, in the organic thin film transistor 10 of the present invention, the charge injection layers 28 and 30 are formed between the source electrode 20 and the organic semiconductor layer 18 which is a layer below the electrode and between the drain electrode 24 and the organic semiconductor layer on the sides on which the source electrode 20 and the drain electrode 24 face each other, and the source electrode 20 and the drain electrode 24 are provided with a shape in which the thickness decreases in the direction opposite to the direction in which the source electrode 20 and the drain electrode 24 face each other. In the present invention, in a case in which the above-described constitution is provided, it is possible to preferably obtain the effect of having the charge injection layers 28 and 30 and improve the mobility.

In the following description, the shape in which the thickness decreases in the direction opposite to the direction in which the source electrode 20 and the drain electrode 24 face each other will also be referred to as "wedge shape" for convenience.

The reasons that the formation of the wedge-shaped charge injection layers on the sides on which the source electrode 20 and the drain electrode 24 face each other so as to be inserted into the portions below both electrodes enables the improvement of the mobility of the organic thin film transistor 10 are not clear, but the present inventors assume as described below.

In the organic thin film transistor 10, charges flow between the end portions on the sides on which the source electrode 20 and the drain electrode 24 face each other in the regions in which the source electrode 20 and the drain electrode 24 are in contact with the organic semiconductor layer 18.

Therefore, as illustrated in FIG. 1B, in the wedge-shaped charge injection layer 28 (the charge injection layer 30), the thickness of the charge injection layer 28 is thin without any limitations in the end portion on the drain electrode 24 side of the region in which charges flow from the source electrode 20 (the drain electrode 24) to the organic semiconductor layer 18 and the source electrode 20 and the organic semiconductor layer 18 are in contact with each other.

Therefore, the charge injection layer 28 is prevented from serving as resistance to the flow of charges, and thus the effect of having the charge injection layer 28 is sufficiently obtained, the charge injection efficiency into the organic semiconductor layer 18 can be improved, and consequently, the organic thin film transistor 10 having a high mobility can be obtained.

In addition, the adhesiveness between the organic semiconductor layer 18 and the source electrode 20 and the drain electrode 24 which are generally made of a metallic material is not always high.

In contrast, in the organic thin film transistor 10 of the present invention, the charge injection layers 28 and 30 inserted into the portions below the source electrode 20 and the drain electrode 24 also act as adhesion layers. Therefore, according to the present invention, it is possible to prevent the peeling faults of the electrodes by improving the adhesiveness between the source electrode 20 and the drain electrode 24 and the organic semiconductor layer 18 (the layer below the electrodes).

In the organic thin film transistor 10 of the present invention, the shape of the charge injection layer 28 on the source electrode 20 side is not particularly limited as long as the shape is a shape in which the charge injection layer is inserted into the portion between the source electrode 20 and the organic semiconductor layer 18 (the layer below the source electrode 20) on a surface of the source electrode 20 on the side facing the drain electrode 24 and the thickness decreases in the direction opposite to the direction in which the source electrode 20 and the drain electrode 24 face each other, that is, a wedge shape.

Therefore, the length w of the charge injection layer 28 in the direction opposite to the direction in which both electrodes face each other from the surface of the source electrode 20 facing the drain electrode 24, the thickness decrease angle of the charge injection layer 28, that is, the angle formed between the upper surface and the lower surface of the charge injection layer 28, that is, the angle θ of the wedge, and the like may be appropriately determined depending on the size of the organic thin film transistor 10, the size of the source electrode 20, the forming material of the charge injection layer 28, the forming material of the organic semiconductor layer 18, the necessary performance of the charge injection layer 28, and the like.

However, in a case in which the length w of the charge injection layer 28 is too long, the migration distance of charges becomes long, which may become disadvantageous in terms of responsiveness and/or switching speed, and thus cautions need to be taken.

In addition, in the organic thin film transistor 10 of the illustrated example, the charge injection layer 28 is formed only in the portion below the elevated region of the source electrode 20, but the charge injection layer 28 may be formed so as to extend beyond the elevated region of the source electrode 20 and cover up to the surface of the source electrode 20 facing the drain electrode 24 (refer to FIG. 1C and the like).

Meanwhile, in the illustrated example, the upper surface of the charge injection layer 28 is the contact surface with the source electrode 20, that is, coincides with the lower surface of the elevated region of the source electrode 20. In addition, the lower surface of the charge injection layer 28 is the contact surface with the organic semiconductor layer 18, that is, coincides with the upper surface of the organic semiconductor layer 18.

What has been described above is also true for the charge injection layer 30 on the drain electrode 24 side.

In addition, the charge injection layer 28 and 30 may be intermittently or continuously formed in the channel width direction.

However, in a case in which the injection area and the like of charges are taken into account, the charge injection layers 28 and 30 are preferably continuously formed in the entire region in the channel width direction.

As the forming material of the charge injection layers 28 and 30, a variety of materials can be used as long as the materials have a function of injecting charges (holes or electrons) into the organic semiconductor layer 18.

As an example, in a case in which the organic semiconductor is a p-type semiconductor, that is, the organic thin film transistor 10 is a p-type organic thin film transistor, as the forming material of the charge injection layers 28 and 30, a variety of materials having a hole-transporting property (hole injection function) can be used.

Examples of the materials having a hole-transporting property include triarylamine compounds, benzidine compounds, pyrazoline compounds, styrylamine compounds, hydrazine compounds, triphenylmethane compounds, carbazole compounds, polysilane compounds, thiophene compounds, phthalocyane compounds, cyanine compounds, merocyanine compounds, oxonol compounds, polyamine compounds, indole compounds, pyrrole compounds, pyrazole compounds, polyarylene compounds, condensed aromatic carbocyclic compounds (naphthalene derivatives, anthracene derivatives, phenanthrene compounds, tetracene derivatives, pyrene derivatives, perylene derivatives, and fluoranthene derivatives), metal complexes having as a nitrogen-containing heterocyclic compound as a ligand, and the like.

Specific examples of low molecular materials include aromatic diamine compounds such as N,N'-bis(3-methylphenyl)-(1,1'-biphenyl)-4,4'-diamine (TPD) and 4,4'-bis[N-(naphthyl)-N-phenyl-amino]biphenyl($\alpha$-NPD), porphyrin compounds such as oxazole, oxadiazole, triazole, imidazole, imidazolone, stilbene derivatives, pyrazoline derivatives, tetrahydroimidazole, polyarylalkane, butadiene, 4,4',4"-tris(N-(3-methylphenyl)N-phenylamino)triphenylamine (m-MTDATA), porphyrin, copper tetraphenylporphyrin, phthalocyanine, phthalocyanine copper, and titanium phthalocyanine oxides, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazine derivatives, silazane derivatives, and the like. Examples of macromolecular materials include polymers such as phenylene vinylene, fluorene, carbazole, indole, pyrene, pyrrole, picoline, thiophene, acetylene, and diacetylene, derivatives thereof, and the like.

As the material having a hole-transporting property, it is also possible to use inorganic materials. Specific examples thereof include vanadium oxide, chromium oxide, copper chromium oxide, manganese oxide, cobalt oxide, nickel oxide, copper oxide, copper potassium oxide, molybdenum oxide, copper indium oxide, silver indium oxide, tungsten oxide, iridium oxide, copper iodide, and the like.

Meanwhile, the material having a hole-transporting property is not limited thereto, and a variety of materials can be used as long as the materials have a smaller ionization potential than organic compounds used for p-type organic semiconductor layers.

On the other hand, in a case in which the organic semiconductor is an n-type semiconductor, that is, the organic thin film transistor 10 is an n-type organic thin film transistor, as the forming material of the charge injection layers 28 and 30, a variety of materials having an electron-transporting property (electron injection function) can be used.

Examples of the materials having an electron-transporting property include condensed aromatic carbocyclic compounds (naphthalene derivatives, anthracene derivatives, phenanthrene compounds, tetracene derivatives, pyrene derivatives, perylene derivatives, and fluoranthene derivatives), 5- to 7-membered heterocyclic compounds containing a nitrogen atom, an oxygen atom, or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzoimidazole, benzotriazole, benzoxazole, benzothiazole, carbazole, purine, triazolopyridazine, triazolopyrimidine, tetrazaindene, oxadiazole, imidazopyridine, pyrrolidine, pyrrolo pyridine, thiadiazolopyridine, dibenzazepine, tribenzazepine, and the like), polyarylene compounds, fluorene compounds, cyclopentadiene compounds, silyl compounds, metal complexes having a nitrogen-containing heterocyclic compound as a ligand, and the like.

As the materials having an electron-transporting property, fullerenes and fullerene derivatives can also be used. Specific examples of the fullerenes include $C_{60}$, phenyl-$C_{61}$-methyl butyrate ester (fullerene derivative referred to as PCBM, [60]PCBM, or $PC_{61}BM$ in documents and the like), $C_{70}$, phenyl-$C_{71}$-methyl butyrate ester (fullerene derivative referred to as PCBM, [70]PCBM, or $PC_{71}BM$ in many documents and the like), the fullerene derivative described in Advanced Functional Materials Vol. 19, pp. 779 to 788 (2009), the fullerene derivative SIMEF described in Journal of the American Chemical Society Vol. 131, p. 16048 (2009), and the like.

As the materials having an electron-transporting property, it is also possible to use inorganic materials. Specific examples thereof include lithium oxide, magnesium oxide, aluminum oxide, calcium oxide, titanium oxide, zinc oxide, strontium oxide, niobium oxide, ruthenium oxide, indium oxide, barium oxide, and the like. In addition, it is also possible to use fluorides, oxides, carbonates, and the like of alkali metals and alkali earth metals.

Meanwhile, the materials having an electron-transporting property are not limited thereto, and a variety of materials can be used as long as the materials have a higher electron affinity than organic compounds used for n-type organic semiconductor layers.

Figure 1C:
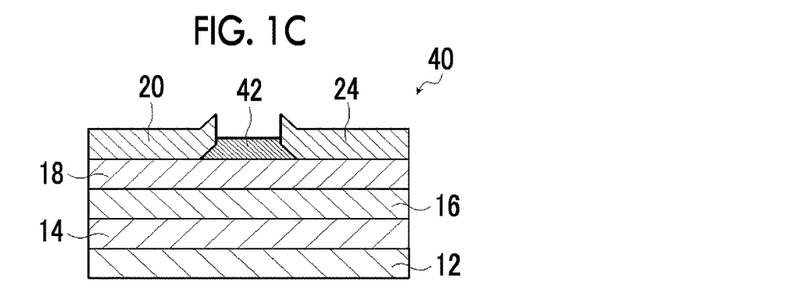
FIG. 1C is a cross-sectional view conceptually illustrating another example of the organic thin film transistor of the present invention.

FIG. 1C conceptually illustrates another example of the organic thin film transistor of the present invention using a cross-sectional view.

Meanwhile, a variety of organic thin film transistors that will be described below are the same as the organic thin film transistor 10 illustrated in FIG. 1A in many portions, and thus the same portion will be given the same reference sign, and different portions will be mainly described below.

In the organic thin film transistor 10 illustrated in FIG. 1A, the charge injection layer 28 on the source electrode 20 side and the charge injection layer 30 on the drain electrode 24 side are separated from each other.

In contrast, in an organic thin film transistor 40 illustrated in FIG. 1C, a charge injection layer 42 is connected to the source electrode 20 side and the drain electrode 24 side. That is, in the organic thin film transistor 40, one charge injection layer 42 corresponding to both the source electrode 20 and the drain electrode 24 is formed so as to cover the channel region.

In this constitution, the charge injection layer 42 also acts as a protective layer for the organic semiconductor layer in the channel region, and thus organic thin film transistors having more favorable durability can be obtained.

In addition, the organic thin film transistor 10 illustrated in FIG. 1A is a bottom gate-top contact-type transistor, but the present invention is not limited thereto.

Figure 1D:
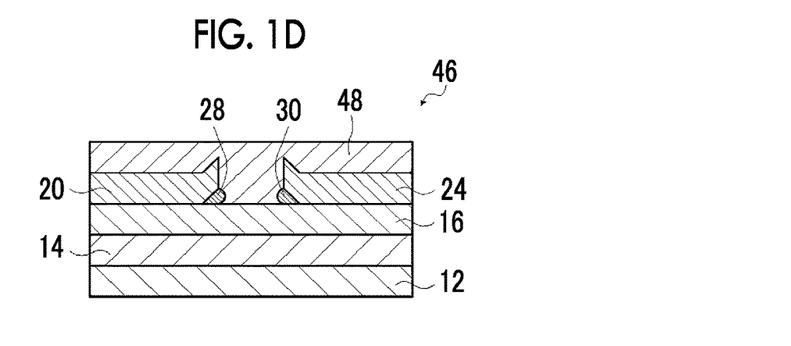
FIG. 1D is a cross-sectional view conceptually illustrating still another example of the organic thin film transistor of the present invention.

For example, the present invention can also be used for a bottom gate-bottom contact-type organic thin film transistor 46 having an organic semiconductor layer 48 that covers the source electrode 20 and the drain electrode 24 as illustrated in FIG. 1D.

In this case, the charge injection layer 28 on the source electrode 20 side is formed so as to be inserted into the portion between the source electrode 20 and the gate insulating layer 16 which is a layer below the source electrode in the end portion of the source electrode 20 on the side facing the drain electrode 24. In addition, the charge injection layer 30 on the drain electrode 24 side is formed so as to be inserted the portion into between the drain electrode 24 and the gate insulating layer 16 which is a layer below the drain electrode in the end portion of the drain electrode 24 on the side facing the source electrode 20.

Furthermore, additionally, the organic thin film transistor of the present invention can also be used for top gate-top contact-type organic thin film transistors in which the gate electrode is located in a layer on the source electrode and the drain electrode.

In top gate-top contact-type organic thin film transistors, the charge injection layer on the source electrode side is formed so as to be inserted into the portion between the source electrode and the organic semiconductor layer which is a layer below the source electrode in the end portion of the source electrode on the side facing the drain electrode. In addition, the charge injection layer on the drain electrode side is formed so as to be inserted the portion into between the drain electrode and the organic semiconductor layer which is a layer below the drain electrode in the end portion of the drain electrode on the side facing the source electrode.

Hereinafter, a method for manufacturing the organic thin film transistor 10 will be described with reference to conceptual views of FIGS. 2A to 2D, thereby describing a method for manufacturing an organic thin film transistor of the present invention.

Figure 2A:
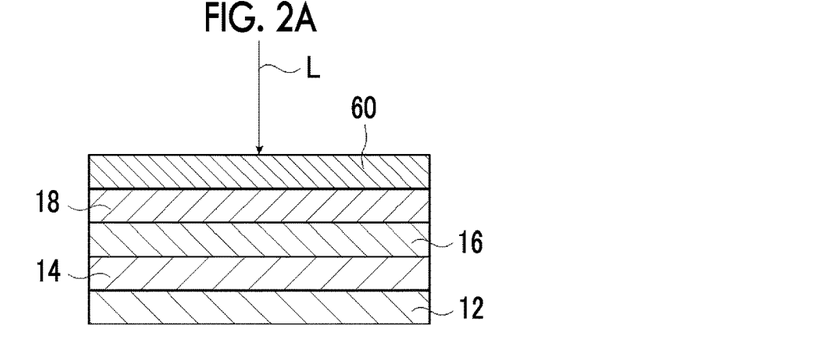
FIG. 2A is a conceptual view for describing an example of a method for manufacturing an organic thin film transistor of the present invention.

First, a laminate in which the gate electrode 14 is formed on the base material 12, the gate insulating layer 16 is formed on the gate electrode 14, and the organic semiconductor layer 18 is formed on the gate insulating layer 16 as illustrated in FIG. 2A is formed.

Meanwhile, any one of the gate electrode 14, the gate insulating layer 16, and the organic semiconductor layer 18 may be formed using a well-known method in which a method for manufacturing an organic thin film transistor (organic semiconductor element) is used.

Next, as illustrated in FIG. 2A, a metal layer 60 which becomes the source electrode 20 and the drain electrode 24 is formed on the organic semiconductor layer 18.

The metal layer 60 may be formed using a well-known method suitable for the forming material of the metal layer 60 such as a gas-phase film-forming method such as vacuum deposition or sputtering or a wet-type film-forming method such as coating or printing. In addition, the metal layer 60 may be patterned using a method in which masks are used or a well-known method in which photoresist and etching are used as necessary.

The thickness of the metal layer 60 may be appropriately set depending on the target thicknesses of the source electrode 20 and the drain electrode 24.

Figure 2B:
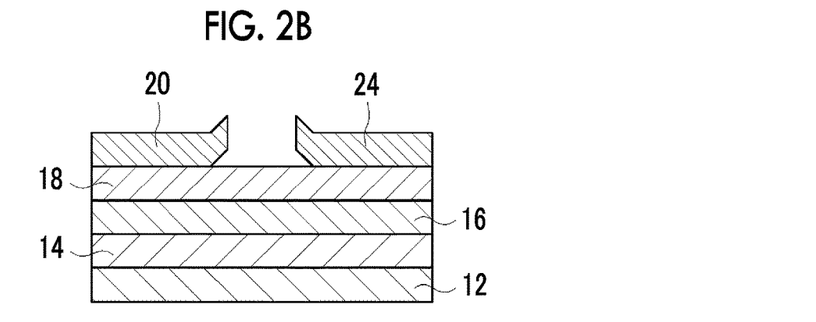
FIG. 2B is a conceptual view for describing an example of the method for manufacturing an organic thin film transistor of the present invention.
Figure 5A:
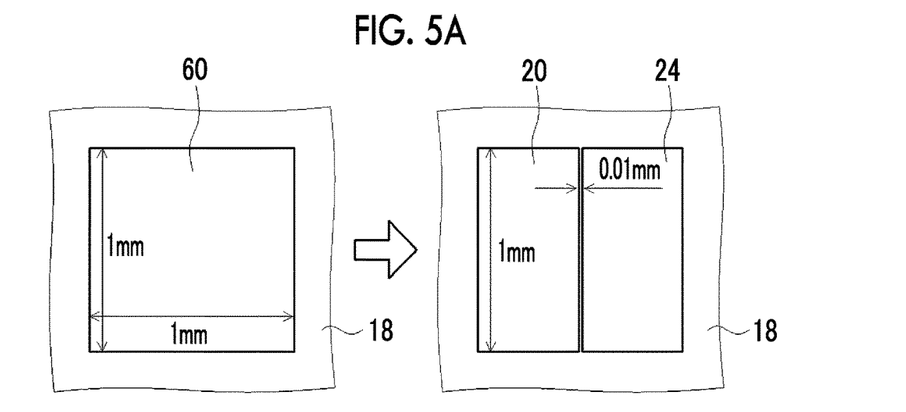
FIG. 5A is a conceptual view for describing the example and the comparative example of the present invention.

Next, as illustrated in FIG. 2A, laser light L is scanned between the source electrode 20 and the drain electrode 24, that is, over a location which becomes the channel region, and thus the metal layer 60 in the location which becomes the channel region is removed by means of abrasion (laser abrasion), thereby forming the source electrode 20 and the drain electrode 24 as illustrated in FIG. 2B (refer to FIG. 5A).

During the formation of the source electrode 20 and the drain electrode 24 by removing the metal layer 60 using the abrasion, the metal layer 60 portions adjacent to the region that is removed by the abrasion are elevated (rolled up). Therefore, each of the source electrode 20 and the drain electrode 24 has a slightly elevated shape on the end portion side on which the source electrode faces the drain electrode or vice versa as illustrated in FIG. 2B, and a wedge-shaped space is formed in the removed region.

Regarding the wavelength, output, pulse width, repeating frequency, and scanning speed of the laser light L that is used to remove the metal layer 60, beam spot systems on the surface of the metal layer 60, conditions under which the metal layer 60 corresponding to the target channel region can be removed by means of abrasion may be appropriately set depending on the material and/or thickness of the metal layer 60.

Meanwhile, a material which becomes charge injection layers as described above is dissolved in an organic solvent and/or water, and a surfactant or the like is added as necessary, thereby preparing a solution P.

Figure 2C:
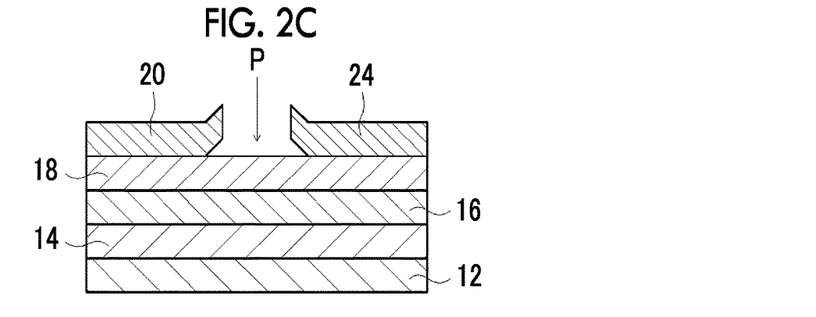
FIG. 2C is a conceptual view for describing an example of the method for manufacturing an organic thin film transistor of the present invention.

This solution P is added dropwise to the portion between the source electrode 20 and the drain electrode 24 formed by means of abrasion, that is, the channel region as illustrated in FIG. 2C. Meanwhile, the solution P may be added dropwise using a well-known method such as a method in which dropwise addition nozzles are used or a method in which a printing method such as ink jet printing is used.

Organic semiconductor materials are often water-repellent (hydrophobic). Therefore, in a case in which the solution P is prepared using a solvent (water-based solvent) that is dissolved in water such as water or ethanol, the solution P added dropwise to the portion between the source electrode 20 and the drain electrode 24 is repelled by the organic semiconductor layer 18, attached to the source electrode 20 and the drain electrode 24, and soaked into the portions below the elevated portions of the source electrode 20 and the drain electrode 24.

Figure 2D:
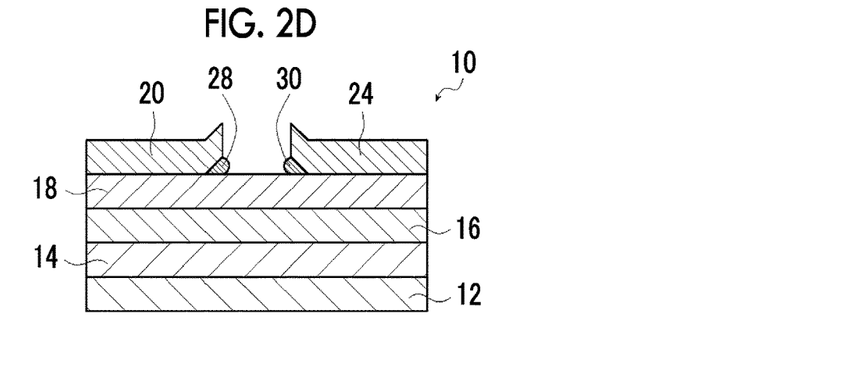
FIG. 2D is a conceptual view for describing an example of the method for manufacturing an organic thin film transistor of the present invention.

Next, the solution P is dried by heating or the like, thereby forming the wedge-shaped charge injection layers 28 and 30 that are separated from each other between both electrodes and the organic semiconductor layer 18 in the end portions on the sides on which the source electrode 20 and the drain electrode 24 face each other as illustrated in FIG. 2D and producing the organic thin film transistor 10.

Meanwhile, in a case in which the organic semiconductor layer 18 (organic semiconductor material) is a hydrophilic material, the organic thin film transistor 10 having the charge injection layers 28 and 30 that are separated from each other as illustrated in FIG. 1A may also be produced by carrying out a water-repellent treatment on the portion corresponding to the channel region of the organic semiconductor layer 18 before the formation of the metal layer 60.

In addition, in a case in which the solution P is prepared using a lyophilic solvent with respect to the organic semiconductor layer 18, it is possible to produce organic thin film transistors having the charge injection layer 42 to which the charge injection layer on the source electrode 20 side and the charge injection layer on the drain electrode 24 side are connected as illustrated in FIG. 1C.

Furthermore, organic thin film transistors having the charge injection layer 42 to which the charge injection layer on the source electrode 20 side and the charge injection layer on the drain electrode 24 side are connected as illustrated in FIG. 1C may be produced by carrying out a lyophilic treatment to the solution P on the portion corresponding to the channel region of the organic semiconductor layer 18 before the formation of the metal layer 60.

Meanwhile, the organic thin film transistor of the present invention can be manufactured using a variety of methods as well as the method illustrated in FIGS. 2A to 2D.

As an example, a method in which the metal layer which becomes the source electrode 20 and the drain electrode 24 is constituted of two layers of a layer of metal or the like which mainly becomes the electrodes and a layer of copper or silver having a higher etching rate than gold, and the metal layer corresponding to the channel region is removed by means of etching, thereby forming the source electrode 20 and the drain electrode 24 is exemplified. According to this method, a wedge-shaped space can be formed between the end portions in which the source electrode 20 and the drain electrode 24 face each other by undercoating attributed to the difference in etching rate, and thus, similarly, the same wedge-shaped charge injection layer can be formed by filling this region with the solution P.

In addition, the source electrode 20 and the drain electrode 24 may also be formed on the wedge-shaped charge injection layer after the formation of the charge injection layer using a well-known method such as a printing method, lithography, or liftoff.

Figure 3A:
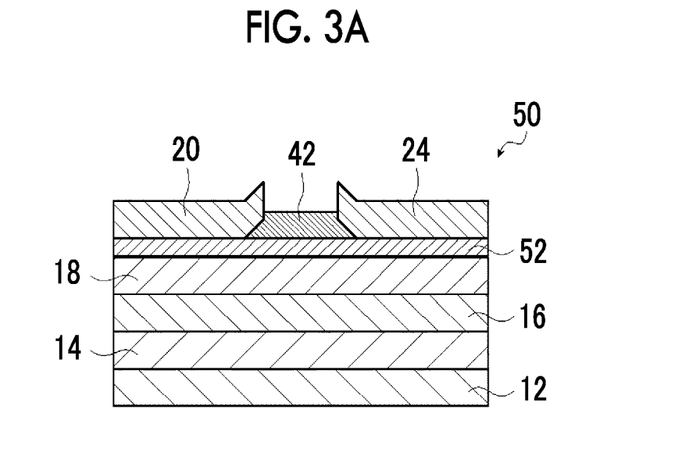
FIG. 3A is a cross-sectional view conceptually illustrating still another example of the organic thin film transistor of the present invention.

FIG. 3A conceptually illustrates still another example of the organic thin film transistor of the present invention using a cross-sectional view.

An organic thin film transistor 50 illustrated in FIG. 3A has a buffer layer 52 below the source electrode 20, the drain electrode 24, and the charge injection layer 42.

As described above, in the manufacturing method of the present invention, the metal layer 60 is formed, and then the metal layer 60 in the location which becomes the channel region is removed by scanning with laser light L, thereby forming the source electrode 20 and the drain electrode 24.

Here, in this manufacturing method, depending on the output and/or wavelength of the laser light L, there are cases in which layers below the source electrode 20 and the drain electrode 24 such as the organic semiconductor layer 18 are damaged and/or altered.

In contrast, in a case in which the buffer layer 52 is provided below the source electrode 20, the drain electrode 24, and the charge injection layer 42, it is possible to prevent the organic semiconductor layer 18 from being damaged by the scanning of laser light. That is, the buffer layer 52 acts as a protective layer for the organic semiconductor layer 18 and the like during the formation of the source electrode 20 and the drain electrode 24.

In the present invention, as the forming material of the buffer layer 52, a variety of materials can be used as long as the materials are conductive enough to allow charges to pass through the materials and can be used to form layers capable of preventing the damages and the like of the organic semiconductor layer 18 caused by laser light and can be selected from, for example, the forming materials of the charge injection layer described above. Particularly, the high molecular materials (semiconductor high molecular materials) are preferably exemplified, and materials having a higher molecular weight than the molecular weight of the forming material of the organic semiconductor layer 18 are more preferably exemplified since the materials are not easily decomposed by laser light and have a stronger effect of protecting the organic semiconductor layer 18 and the like.

Specific examples thereof include polyaniline, polythiophene, polypyrrole, derivatives thereof, and the like.

As the thickness of the buffer layer 52, a thickness in which the organic semiconductor layer 18 and the like below the source electrode 20 and the drain electrode 24 can be protected may be appropriately set depending on the forming material of the buffer layer 52, the output of the laser light L, the wavelength of the laser light L, the scanning speed of the laser light L, and the like.

In the present invention, the buffer layer is not always formed so as to cover the entire surface of the layer below the source electrode 20, the drain electrode 24, and the charge injection layer 42 as in the organic thin film transistor 50 illustrated in FIG. 3A.

For example, the buffer layer 58 may be formed only below the source electrode 20 and the drain electrode 24 and may not be provided below the charge injection layer 42 as in an organic thin film transistor 56 illustrated in FIG. 3B.

That is, during the removal of the metal layer 60 by the scanning of the laser light L, the buffer layer 58 may also be removed by means of abrasion together with the metal layer 60. Even in this constitution, the effect of protecting the organic semiconductor layer 18 and the like can be sufficiently obtained.

Figure 3B:
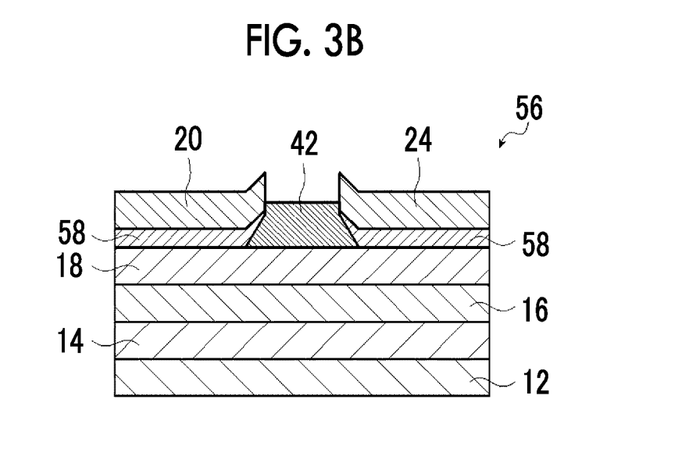
FIG. 3B is a cross-sectional view conceptually illustrating still another example of the organic thin film transistor of the present invention.

Meanwhile, the organic thin film transistors 50 and 56 illustrated in FIGS. 3A and 3B have one charge injection layer 42 to which the charge injection layer on the source electrode 20 side and the charge injection layer on the drain electrode 24 side are connected similarly to the example illustrated in FIG. 1C.

However, the constitution having the buffer layer 52 or the buffer layer 58 can be preferably used in constitutions in which the charge injection layer 28 on the source electrode 20 side and the charge injection layer 30 on the drain electrode 24 side are separated from each other as illustrated in FIG. 1A.

The organic thin film transistor 50 illustrated in FIG. 3A can be manufactured by forming the buffer layer 52 on the organic semiconductor layer 18 before the formation of the metal layer 60 in the manufacturing method illustrated in FIGS. 2A to 2D.

Meanwhile, the buffer layer 52 may be formed using a well-known method suitable for the material that becomes the buffer layer 52, as an example, a coating method in which paint is prepared by dissolving the material that becomes the buffer layer 52 in an organic solvent and/or water and is applied and dried.

The organic thin film transistor 56 illustrated in FIG. 3B can also be manufactured in the same manner.

Hitherto, the organic thin film transistor and the method for manufacturing an organic thin film transistor of the present invention have been described in detail, but the present invention is not limited to the above-described examples, and it is needless to say that a variety of improvements or modifications may be made within the scope of the gist of the present invention.

EXAMPLES

Hereinafter, the organic thin film transistor and the method for manufacturing an organic thin film transistor of the present invention will be described in more detail using specific examples of the present invention.

[Production of Laminate 64]

<Preparation of Base Material 12>

A 2.5×2.5 cm laminated product in which a removable film (manufactured by PANAC Co., Ltd., PANAPROTECT ETY100A) was laminated on a polyimide film (manufactured by Ube Industries, Ltd., UPILEX 50S) which was to serve as a base material 12 was prepared.

This laminated product was attached to a 2.5×2.5 cm glass carrier using double-sided pressure-sensitive tape (manufactured by 3M Japan Limited, 4390) in a vacuum laminator (manufactured by NPC Incorporated, LM-20×20) heated to 150° C. The laminated product was attached so that the polyimide film became the upper surface.

<Formation of Gate Electrode 14>

In an atmosphere at a pressure of 1 Pa into which Ar gas was introduced, a 100 nm-thick aluminum layer was formed on the surface of the polyimide film by means of high-frequency magnetron sputtering in which an aluminum target was used, thereby producing a gate electrode 14.

<Formation of Gate Insulating Layer 16>

A coating fluid was prepared by mixing a PGMEA solution containing 20% by mass of poly(4-vinylphenol) (manufactured by Sigma-Aldrich Co. LLC, 436216) and a PGMEA solution containing 10% by mass of poly (melamine-co-formaldehyde) (manufactured by Sigma-Aldrich Co. LLC, 418560) in a volume ratio of 1:2.

Meanwhile, "PGMEA" refers to "propylene glycol-1-monomethylether-2-acetate".

This coating fluid was applied onto the gate electrode 14 by means of rotary application. Next, the coating fluid was heated at 150° C. for one hour on a hot plate in a dried nitrogen atmosphere, thereby forming a 0.5 μm-thick gate insulating layer 16.

Therefore, a laminate 64 in which the gate electrode 14 and the gate insulating layer 16 were laminated on the base material 12 made of the polyimide film was produced.

Comparative Example 1

<Formation of Organic Semiconductor Layer 18>

As a coating fluid A which was to serve as an organic semiconductor layer 18, a toluene solution containing 0.3% by mass of C8-BTBT was prepared.

Figure 4:
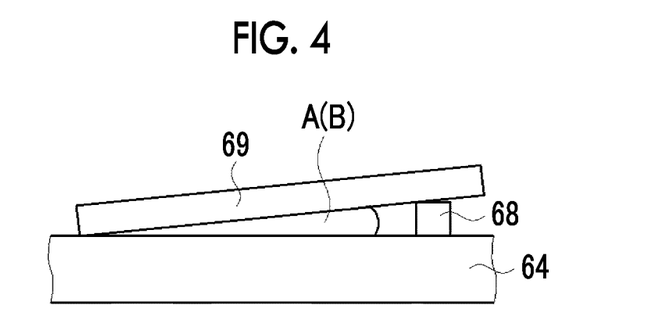
FIG. 4 is a conceptual view for describing an example and a comparative example of the present invention.

The laminate 64 was placed on a hot plate at 90° C. Next, as conceptually illustrated in FIG. 4, a support 68 was placed on the gate insulating layer 16 of the laminate 64, and a 0.7 mm-thick glass solution-adsorbed body 69 was placed on the support 68 and the gate insulating layer 16.

The coating fluid A heated to 90° C. was injected into a portion between the gate insulating layer 16 and the solution-adsorbed body 69, and an inverted Petri plate that covered the solution-adsorbed body 69 was worn.

After the toluene was fully evaporated, the Petri plate and the solution-adsorbed body were removed. The organic semiconductor layer 18 made of a plate-like crystal film of C8-BTBT was formed on the gate insulating layer 16 in the above-described manner.

<Production of Source Electrode 20 and Drain Electrode 24>

As illustrated in the left-hand side of FIG. 5A, gold was vacuum-deposited on the organic semiconductor layer 18 through a nickel shadow mask, thereby forming a 50 nm-thick 1×1 mm metal layer 60 which was to serve as a source electrode 20 and a drain electrode 24. A plurality of metal layers 60 was formed at intervals of 0.1 mm.

Next, laser light L was focused and scanned over the metal layer 60 as illustrated in FIG. 2A, thereby removing a 0.01 mm-wide portion from the center as illustrated in the right-hand side of FIG. 5A and dividing the metal layer 60 into two parts. For the laser light L, a Nd:YAG pulse laser (wavelength: 532 nm, pulse width: 10 ps or less, repeating frequency: 500 kHz) was used. The scanning speed of the laser light L was set to 5 m/s. In addition, the average output of the laser light L was finely adjusted so as to be capable of removing the 0.01 mm-wide portion from the metal layer 60 and was approximately 0.1 W on the surface of the metal layer 60.

Therefore, a bottom gate-top contact-type p-type organic thin film transistor having a channel length of 0.01 mm and a channel width of 1 mm in which the metal layer 60 divided into two parts corresponded to the source electrode 20 and the drain electrode 24 respectively was produced.

Figure 5B:
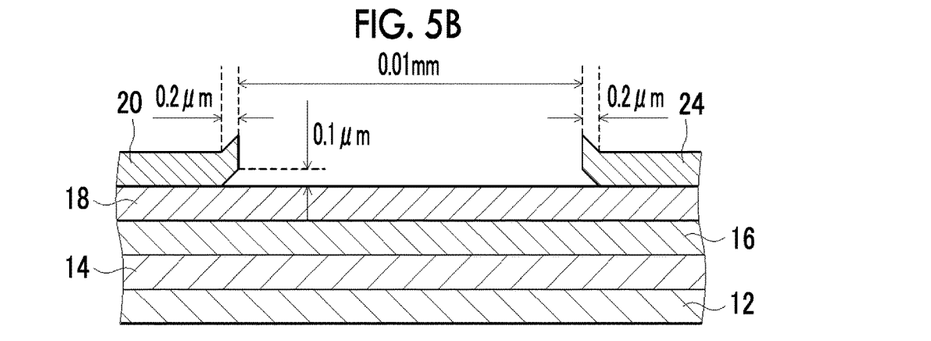
FIG. 5B is a conceptual view for describing the example and the comparative example of the present invention.

As a result of observing a cross section of a channel portion of the source electrode 20 and the drain electrode 24 formed by removing the metal layer 60 using a scanning electron microscope, it was found that the electrode end portions were elevated in a shape having a width of 0.2 μm and a height of 0.1 μm and a wedge-shaped space was formed as illustrated in FIG. 5B.

Meanwhile, FIGS. 5A and 5B are simply conceptual views, and the relationships among the sizes of the respective portions in the drawings are different from the actual dimensions described.

Comparative Example 2

A PEDOT-PSS aqueous solution (manufactured by Heraeus Clevios, Clevios P VP AI 4083) was prepared by mixing 1% by mass of a fluorine-based surfactant (manufactured by Du Pont, Zonyl FS-300) and 1% by mass of 3-glycidoxypropyltrimethoxysilane.

In Comparative Example 1, before the formation of the metal layer 60, the prepared aqueous solution was rotary-applied onto the organic semiconductor layer 18 and then heated on a hot plate at 100° C. for 30 minutes, thereby forming a charge injection layer 70 on the organic semiconductor layer 18.

Figure 6A:
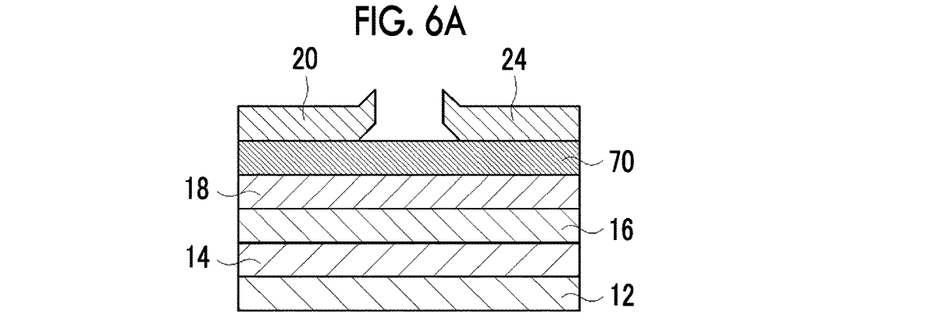
FIG. 6A is a conceptual view for describing the comparative example of the present invention.

Afterwards, the same process as in Comparative Example 1 was carried out, thereby producing a bottom gate-top contact-type p-type organic thin film transistor having a channel length of 0.01 mm and a channel width of 1 mm in which the charge (hole) injection layer 70 made of PEDOT-PSS was provided throughout the entire interface between the organic semiconductor layer 18 and the source electrode 20 and the drain electrode 24 as conceptually illustrated in FIG. 6A.

Comparative Example 3

A PEDOT-PSS aqueous solution (manufactured by Heraeus Clevios, Clevios P VP AI 4083) was prepared by mixing 1% by mass of 3-glycidoxypropyltrimethoxysilane.

In Comparative Example 1, the scanning of the laser light L was not carried out, two 1×1 mm metal layers 60 adjacent to each other at an interval of 0.1 mm were respectively considered as a source electrode 72 and a drain electrode 74, and the prepared aqueous solution was added dropwise to a portion between the electrodes (channel portion).

Since the organic semiconductor layer 18 (C8-BTBT) was water-repellent, the aqueous solution was repelled by the organic semiconductor layer 18 and stably attached to the vicinities of the end portions of the source electrode 72 and the drain electrode 74 facing the other electrode on the upper surface from the end portions.

Next, the aqueous solution was heated on a hot plate at 100° C. for 30 minutes, thereby forming a charge (hole) injection layer 76 in the end surface of the source electrode 72 facing the drain electrode 74 and a charge injection layer 78 in the end portion of the drain electrode 74 facing the source electrode 72 respectively.

Figure 6B:
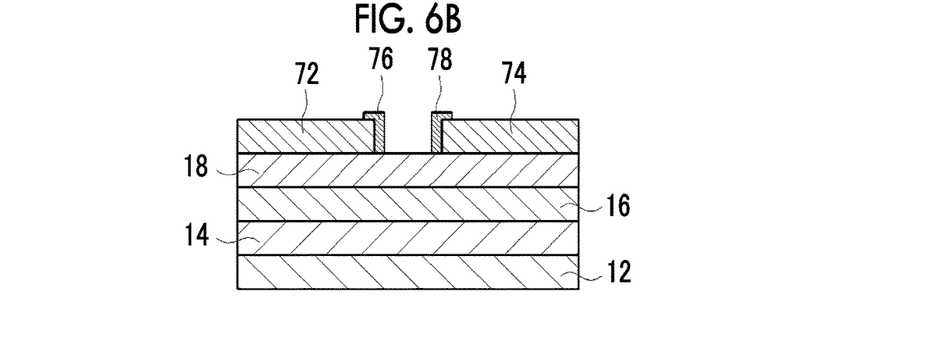
FIG. 6B is a conceptual view for describing the comparative example of the present invention.

Therefore, a bottom gate-top contact-type p-type organic thin film transistor having a channel length of 0.1 mm and a channel width of 1 mm in which the electrode end portions were coated with the charge (hole) injection layers made of PEDOT-PSS as conceptually illustrated in FIG. 6B was produced.

Comparative Example 4

As a coating fluid B which became the organic semiconductor layer 18, an anisole solution containing 0.3% by mass of N,N'-bis(cyclohexyl)naphthalene-1,4,5,8-bis(dicarboxyimide) was prepared.

Meanwhile, N,N'-bis(cyclohexyl)naphthalene-1,4,5,8-bis(dicarboxyimide) had the following structure.

A bottom gate-top contact-type n-type organic thin film transistor having a channel length of 0.01 mm and a channel width of 1 mm was produced in the same manner as in Comparative Example 1 except for the fact that the coating fluid B was used after heated to 120° C. instead of the coating fluid A, and the drying temperature of the coating fluid B was set to 120° C.

Comparative Example 5

An ethanol solution containing 0.5% by mass of a fluorine-based surfactant (manufactured by Du Pont, Zonyl FS-300) and 2% by mass of a zinc acetylacetonate hydrate was prepared.

In Comparative Example 4, before the formation of the metal layer 60, the prepared ethanol solution was rotary-applied onto the organic semiconductor layer 18 and then heated on a hot plate at 140° C. for one hour, thereby forming the charge injection layer 70 on the organic semiconductor layer 18.

Afterwards, the same process as in Comparative Example 4 was carried out, thereby producing a bottom gate-top contact-type n-type organic thin film transistor having a channel length of 0.01 mm and a channel width of 1 mm in which the charge (electron) injection layer 70 made of zinc oxide was provided throughout the entire interface between the organic semiconductor layer 18 and the source electrode 20 and the drain electrode 24 as conceptually illustrated in FIG. 6A.

Comparative Example 6

An ethanol solution containing 2% by mass of a zinc acetylacetonate hydrate was prepared.

In Comparative Example 4, the scanning of the laser light L was not carried out, two 1×1 mm metal layers 60 adjacent to each other at an interval of 0.1 mm were respectively considered as the source electrode 72 and the drain electrode 74, and the prepared ethanol solution was added dropwise to a portion between the electrodes (channel portion).

Since the organic semiconductor layer 18 (N,N'-bis(cyclohexyl)naphthalene-1,4,5,8-bis(dicarboxyimide)) was water-repellent, the ethanol solution was repelled by the organic semiconductor layer 18 and stably attached to the vicinities of the end portions of the source electrode 72 and the drain electrode 74 facing the other electrode on the upper surface from the end portions.

Next, the ethanol solution was heated on a hot plate at 140° C. for one hour, thereby forming the charge injection layer 76 on the end surface of the source electrode 72 facing the drain electrode 74 and the charge injection layer 78 on the end surface of the drain electrode 74 facing the source electrode 72 respectively.

Therefore, a bottom gate-top contact-type n-type organic thin film transistor having a channel length of 0.1 mm and a channel width of 1 mm in which the electrode end portions were coated with the charge (electron) injection layers made of zinc oxide as conceptually illustrated in FIG. 6B was produced.

Example 1

The same p-type organic thin film transistor as in Comparative Example 1 was produced.

Meanwhile, a PEDOT-PSS aqueous solution (manufactured by Heraeus Clevios, Clevios P VP AI 4083) was prepared by mixing 1% by mass of 3-glycidoxypropyltrimethoxysilane.

The prepared aqueous solution was added dropwise to a portion between the source electrode 20 and the drain electrode 24 (channel portion).

Since the organic semiconductor layer 18 (C8-BTBT) was water-repellent, the aqueous solution was repelled by the organic semiconductor layer 18, intruded into the elevated portions of the source electrode 20 and the drain electrode 24, and, furthermore, was stably attached to the end surfaces of the electrodes.

Next, the aqueous solution was heated on a hot plate at 100° C. for 30 minutes, thereby forming a charge (hole) injection layer made of PEDOT-PSS.

Therefore, a bottom gate-top contact-type p-type organic thin film transistor having a channel length of 0.01 mm and a channel width of 1 mm in which the wedge-shaped charge injection layer 28 was formed below the end portion of the source electrode 20 facing the drain electrode 24, and the wedge-shaped charge injection layer 30 was formed below the end portion of the drain electrode 24 facing the source electrode 20 respectively as illustrated in FIG. 1A was produced.

Example 2

The same n-type organic thin film transistor as in Comparative Example 4 was produced.

Meanwhile, an ethanol solution containing 2% by mass of a zinc acetylacetonate hydrate was prepared.

The prepared ethanol solution was added dropwise to a portion between the source electrode 20 and the drain electrode 24 (channel portion).

Since the organic semiconductor layer 18 (N,N'-bis(cyclohexyl)naphthalene-1,4,5,8-bis(dicarboxyimide)) was water-repellent, the aqueous solution was repelled by the organic semiconductor layer 18, intruded into the elevated portions of the source electrode 20 and the drain electrode 24, and, furthermore, was stably attached to the end surfaces of the electrodes.

Next, the aqueous solution was heated on a hot plate at 140° C. for one hour, thereby forming a charge (electron) injection layer made of PEDOT-PSS.

Therefore, a bottom gate-top contact-type n-type organic thin film transistor having a channel length of 0.01 mm and a channel width of 1 mm in which the wedge-shaped charge injection layer 28 was formed below the end portion of the source electrode 20 facing the drain electrode 24, and the wedge-shaped charge injection layer 30 was formed below the end portion of the drain electrode 24 facing the source electrode 20 respectively as illustrated in FIG. 1A was produced.

[Evaluation]

The light of the Nd:YAG pulse laser (wavelength: 266 nm, pulse width: 6 ns) was collected and scanned over the outer circumference of the produced organic thin film transistor, thereby removing a 0.05 mm-wide portion from the organic semiconductor layer 18 and forming a pattern. Next, the polyimide film which was the base material 12 was peeled off from the glass carrier of the laminate 64.

Ten places were arbitrarily selected from the organic thin film transistor which had been peeled off from the glass carrier, and the following evaluation was carried out.

First, the respective electrodes in the organic thin film transistor and individual terminals in a manual prober connected to 4155C manufactured by Agilent Technologies were connected to one another, the drain current-gate voltage ($I_d$-$V_g$) characteristics were measured, and the electron field-effect mobility (unit: cm²/(V·s)) was computed. Meanwhile, for the p-type organic thin film transistors, the drain voltage ($V_d$) was set to −40 V, and, for the n-type organic thin film transistors, the drain voltage ($V_d$) was set to 40 V, respectively.

After that, the base material 12 was wound around a round bar having a radius of 0.5 cm with the rear surface (the surface on which the organic thin film transistor was not formed) facing inside, thereby curving the organic thin film transistor. In addition, the polyimide film was removed from the round bar, and then the number of the organic thin film transistors in which the source electrode 20 and the drain electrode 24 were peeled off from the organic semiconductor layer 18 (the charge injection layer 70) (the number of elements) was observed and investigated using an optical microscope.

The results are as described below. Meanwhile, the descriptions in parentheses indicate the form of the charge injection layers.

p-Type Organic Thin Film Transistors

Comparative Example 1 (No Charge Injection Layer)

Mobility average value: $8\times10^{-2}$ cm²/(V·s), the number of elements in which the electrodes were peeled off: seven Comparative Example 2 (the Charge Injection Layer Coated the Entire Surface of the Organic Semiconductor)

Mobility average value: $5\times10^{-4}$ cm²/(V·s), the number of elements in which the electrodes were peeled off: five Comparative Example 3 (the Charge Injection Layers Coated the Surfaces of the Electrodes Facing the Other Electrode)

Mobility average value: $1\times10^{-1}$ cm²/(V·s), the number of elements in which the electrodes were peeled off: two Example 1 (the Wedge-Shaped Charge Injection Layers were Formed Below the Electrode End Portions)

Mobility average value: $2\times10^{-1}$ cm²/(V·s), the number of elements in which the electrodes were peeled off: zero n-Type Organic Thin Film Transistors Comparative Example 4 (No Charge Injection Layer)

Mobility average value: $4\times10^{-2}$ cm²/(V·s), the number of elements in which the electrodes were peeled off: five Comparative Example 5 (the Charge Injection Layer Coated the Entire Surface of the Organic Semiconductor)

Mobility average value: $3\times10^{-4}$ cm²/(V·s), the number of elements in which the electrodes were peeled off: two Comparative Example 6 (the Charge Injection Layers Coated the Surfaces of the Electrodes Facing the Other Electrode)

Mobility average value: $7\times10^{-2}$ cm²/(V·s), the number of elements in which the electrodes were peeled off: one Example 2 (the Wedge-Shaped Charge Injection Layers were Formed Below the Electrode End Portions)

Mobility average value: $9\times10^{-2}$ cm²/(V·s), the number of elements in which the electrodes were peeled off: zero As described above, the organic thin film transistor of the present invention in which the wedge-shaped charge injection layers are provided below the portions of the source electrode 20 and the drain electrode 24 facing the other electrode has a higher mobility and superior characteristics compared to organic thin film transistors of the related art in which no charge injection layers are provided, flat charge injection layers are provided below the entire lower surfaces of the electrodes, or flat charge injection layers are provided on the surfaces of electrodes facing the other electrode.

In addition, in the organic thin film transistor of the present invention, the charge injection layers also function as adhesion layers, and thus the adhesive forces of the electrodes are strong, and the occurrence of peeling faults can also be prevented.

From the above-described results, the effects of the present invention are clear.

The present invention can be preferably used for the manufacturing of a variety of devices for which the organic thin film transistor is used.

EXPLANATION OF REFERENCES 10, 40, 46, 50, 56: organic thin film transistor
12: base material
14: gate electrode
16: gate insulating layer
18, 48: organic semiconductor layer
20, 72: source electrode
24, 74: drain electrode
28, 30, 42, 76, 78: charge injection layer
52, 58: buffer layer
60: metal layer
64: laminate
68: support
69: solution-adsorbed body

What is claimed is:

1. An organic thin film transistor comprising:
a base material;
gate electrode, a gate insulating layer, a first organic semiconductor layer, a source electrode, and a drain electrode which are formed on the base material; and
each of the source electrode and the drain electrode have a raised shape in an end portion on a side on which the source electrode faces the drain electrode or vice versa;
a first charge injection layer is provided under the raised shaped portion between the source electrode and the first organic semiconductor layer;
a second charge injection layer is provided under the raised shaped portion between the drain electrode and the first organic semiconductor layer;
wherein the raised shaped portion of the source electrode is located at the end portion of the source electrode in a first direction from the source electrode toward the drain electrode and the raised shaped portion of the drain electrode is located at the end portion of the drain electrode in a second direction from the drain electrode toward the source electrode; and
each of the first charge injection layer and the second charge injection layer have a thickness below the end portions of the source electrode and the drain electrode in which the thickness decreases in a direction opposite to the direction in which the source electrode and the drain electrode faces each other; and
a second organic semiconductor layer covers the source electrode and the drain electrode and fills a wedge-shaped space between the source electrode and the drain electrode.

2. The organic thin film transistor according to claim 1, wherein the gate electrode, the gate insulating layer, the first organic semiconductor layer, and the source electrode and the drain electrode are laminated in this order from the base material.

3. The organic thin film transistor according to claim 1, wherein the first organic semiconductor layer, and the source electrode and the drain electrode are laminated in this order from the base material.

4. The organic thin film transistor according to claim 1, wherein the base material is a flexible film.

5. The organic thin film transistor according to claim 1, wherein the first organic semiconductor layer is made of a p-type organic semiconductor, and the first charge injection layer and the second charge injection layer have a hole-transporting property.

6. The organic thin film transistor according to claim 1, wherein the first organic semiconductor layer is made of an n-type organic semiconductor, and the first charge injection layer and the second injection layer have an electron-transporting property.

7. A method for manufacturing an organic thin film transistor having a base material, a gate electrode, a gate insulating layer, a first organic semiconductor layer, a source electrode, a drain electrode, which are formed on the base material, and a first charge injection layer and a second charge injection layer, which are formed on the first organic semiconductor layer, the method comprising:
a step of forming a metal layer which becomes the source electrode and the drain electrode;
a step of forming the source electrode and the drain electrode by removing a part of the metal layer by scanning with laser light, and forming a first space between the source electrode and the drain electrode, each of the source electrode and the drain electrode have a raised shape in an end portion on a side on which the source electrode faces the drain electrode or vice versa;
a step of forming the first charge injection layer and the second charge injection layer by adding dropwise a solution including a forming material of the first charge injection layer and the second charge injection layer in a regions from which the metal layer is removed, wherein
the regions are formed under the raised shaped between the source electrode and the first organic semiconductor layer and under the raised shaped between the drain electrode and the first organic semiconductor layer and drying the solution;
the raised shaped of the source electrode that is located at the end portion of the source electrode in a first direction from the source electrode toward the drain electrode, and the raised shaped of the drain electrode is located at the end portion of the drain electrode in a second direction from the drain electrode toward the source electrode;
each of the first charge injection layer and the second charge injection layer have a thickness below the end portions of the source electrode and the drain electrode in which the thickness decreases in a direction opposite to the direction in which the source electrode and the drain electrode faces each other; and a second organic semiconductor layer covers the source electrode and the drain electrode and fills a wedge-shaped space between the source electrode and the drain electrode.

8. The method for manufacturing an organic thin film transistor according to claim 7, wherein,
in the step of forming the metal layer, a surface on which the metal layer is formed has water repellency.

9. The method for manufacturing an organic thin film transistor according to claim 7, wherein, in the step of forming the metal layer, a surface on which the metal layer is formed is the first organic semiconductor layer.

\* \* \* \* \*